US 12,096,641 B2

(12) United States Patent
Mei et al.

(10) Patent No.: US 12,096,641 B2
(45) Date of Patent: Sep. 17, 2024

(54) POLYIMIDE-BASED TRANSISTOR DEVICES AND METHODS OF FABRICATING THE SAME

(71) Applicant: Purdue Research Foundation, West Lafayette, IN (US)

(72) Inventors: Jianguo Mei, West Lafayette, IN (US); Aristide Gumyusenge, Palo Alto, CA (US)

(73) Assignee: Purdue Research Foundation, West Lafayette, IN (US)

( * ) Notice: Subject to any disclaimer, the term of this patent is extended or adjusted under 35 U.S.C. 154(b) by 553 days.

(21) Appl. No.: 17/337,707

(22) Filed: Jun. 3, 2021

(65) Prior Publication Data

US 2022/0223808 A1    Jul. 14, 2022

Related U.S. Application Data (60) Provisional application No. 63/034,219, filed on Jun. 3, 2020.

(51) Int. Cl.
| | | |
|---|---|---|
| *H01L 51/05* | (2006.01) | |
| *C08G 73/10* | (2006.01) | |
| *C08L 79/08* | (2006.01) | |
| *H10K 10/46* | (2023.01) | |
| *H10K 85/10* | (2023.01) | |

(52) U.S. Cl.
CPC ....... *H10K 10/471* (2023.02); *C08G 73/1039* (2013.01); *C08L 79/08* (2013.01); *H10K 10/484* (2023.02); *H10K 85/113* (2023.02)

(58) Field of Classification Search
CPC .. H10K 10/471; H10K 85/113; H10K 10/484; H10K 10/46; H10K 10/468; H10K 59/125; C08G 73/1039; C08L 79/08
See application file for complete search history.

(56) References Cited

U.S. PATENT DOCUMENTS 5,612,228 A  *  3/1997  Shieh ................ H01L 27/1214
                                                        257/E27.111
2019/0372006 A1 * 12/2019  Mei ....................... H10K 71/15

FOREIGN PATENT DOCUMENTS

| WO | WO-03052841 A1 * | 6/2003 | ........... C09B 57/008 |
| WO | WO-2007136098 A1 * | 11/2007 | ......... H01L 51/0001 |
| WO | WO-2019027899 A1 * | 2/2019 | ............ C08F 214/22 |
| WO | WO-2020058850 A1 * | 3/2020 | ........... B01D 53/228 |

OTHER PUBLICATIONS

Gumyusenge, A. et al., "Semiconducting Polymer Blends that Exhibit Stable Charge Transport at High Temperatures," Science, 362, (2018) pp. 1131-1134.

* cited by examiner

*Primary Examiner* — Ermias T Woldegeorgis
(74) *Attorney, Agent, or Firm* — Hartman Global IP Law; Gary M. Hartman; Domenica N.S. Hartman (57) ABSTRACT

A transistor device that includes a substrate comprising metallic gate contacts, a dielectric layer on the substrate comprising a polyimide or derivative thereof, a semiconductor layer on the dielectric layer comprising a semiconducting polymer confined in a host matrix material comprising a polyimide or derivative thereof, and source and drain contacts on the semiconductor layer.

18 Claims, 8 Drawing Sheets

POLYIMIDE-BASED TRANSISTOR DEVICES AND METHODS OF FABRICATING THE SAME

CROSS REFERENCE TO RELATED APPLICATIONS

This application claims the benefit of U.S. Provisional Application No. 63/034,219 filed Jun. 3, 2020, the contents of which are incorporated herein by reference.

STATEMENT REGARDING FEDERALLY SPONSORED RESEARCH OR DEVELOPMENT

This invention was made with government support under Contract Nos. N00014-16-1-2551 and N00014-19-1-2027), awarded by the U.S. Navy Office of Naval Research. The government has certain rights in the invention.

BACKGROUND OF THE INVENTION

The present invention generally relates to electronic components and devices. The invention particularly relates to polyimide-based transistor devices and methods of producing such devices.

Organic-based electronics that are conformable, flexible, low-cost, and lightweight have been studied for the past two decades as alternatives for silicon-based technologies. Today, flexible electronics are on the verge of becoming a commodity in daily life applications, such as flexible displays and wearables. One class of application that is yet to benefit from these lightweight and cost-effective electronics is high-temperature applications, especially in the aerospace, automobile, and gas and oil drilling industries. These applications require lightweight materials that can sustain harsh thermal conditions for prolonged operation times without requiring additional insulation or cooling.

Currently, active and/or passive cooling and insulation are needed for such applications, resulting in a weight and cost burden especially in aerospace engineering. Carbides and wide-band gap inorganics have been studied as thermally-robust alternatives, but their cost and complicated processing limit their wide adoption. With such requirements, plastic electronics based on thermally-stable plastic substrates, dielectrics, as well as semiconductors potentially become excellent candidates. However, the long-standing challenge towards achieving thermal stability has been the design, at least in part, of thermally-stable semi-conductors as electronic properties are temperature-dependent and degrade especially at extremely high temperatures. As such, there is an ongoing demand for devices capable of operating at elevated temperatures.

BRIEF DESCRIPTION OF THE INVENTION

The present invention provides transistor devices suitable for use in high temperature environments and methods of fabrication of such devices.

According to one aspect of the invention, a transistor device is provided that includes a substrate comprising metallic gate contacts, a dielectric layer on the substrate comprising a polyimide or derivative thereof, a semiconductor layer on the dielectric layer comprising a semiconducting polymer confined in a host matrix material comprising a polyimide or derivative thereof, and source and drain contacts on the semiconductor layer.

According to another aspect of the invention, a method is provided for fabricating a transistor device that includes patterning and depositing metallic gate contacts on a substrate, producing a dielectric layer on the substrate comprising polyimide or derivative thereof, producing a semiconductor layer on the dielectric layer comprising a semiconducting polymer confined in a host matrix material comprising a polyimide or derivative thereof, and depositing source and drain contacts on the semiconductor layer.

Technical effects of transistor device and method described above preferably include the ability to provide improved reliability to electronic devices used in high temperature environments.

Other aspects and advantages of this invention will be appreciated from the following detailed description.

BRIEF DESCRIPTION OF THE DRAWINGS

FIGS. 6A through 6C represent blend compatibility and morphology of the polymer blend represented in FIG. 5.

FIGS. 7A and 7B represent an effect of the host's capacitance on the blend's electronic performance.

DETAILED DESCRIPTION OF THE INVENTION

Disclosed herein are methods for producing high-temperature plastic electronics including plastic, thermally stable transistor devices capable of operation at temperatures in excess of 200° C. Generally, the transistor devices may include a substrate having gate contacts thereon, a dielectric layer on the substrate, a semiconductor layer (e.g., channel layer) on the dielectric layer, and source/drain contacts on the semiconductor layer. The substrate, dielectric layer, and the semiconductor layer may all be formed of plastic materials, such as but not limited to various polyimides. In certain embodiments, the semiconductor layer may be formed from a mixture of two or more polymer materials (referred to herein as "polymer blends" or "blends") to form a bicontinuous network in which a semiconducting polymer is surrounded by a high-$T_g$ host matrix material that promotes thermal stability in the transistor device.

Figure 1A:
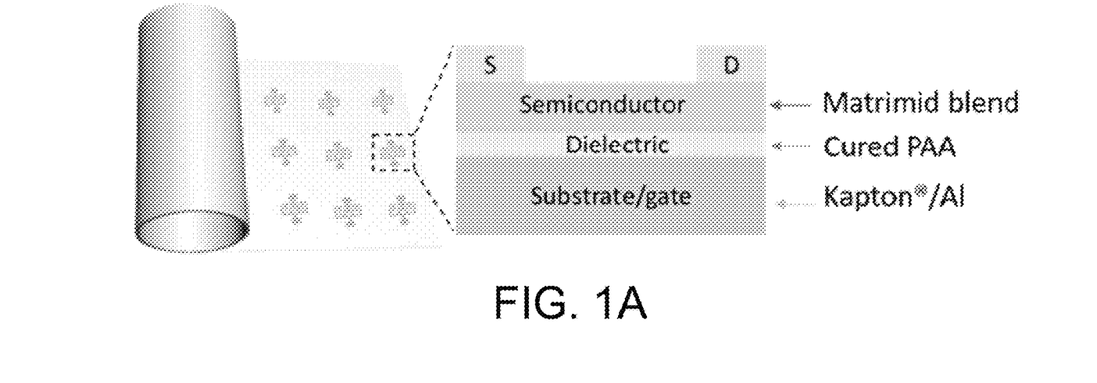
FIGS. 1A through 1E represent (FIG. 1A) a device architecture of a plastic transistor device using polyimides, and molecular structures of (FIG. 1B) PII-2T, a conjugated polymer used in certain semiconducting blends, (FIG. 1C) Matrimid® (MI), a high-$T_g$ matrix, and (FIG. 1D) PAA used as a precursor for processing (FIG. 1E) a PI dielectric layer.
Figure 1B:
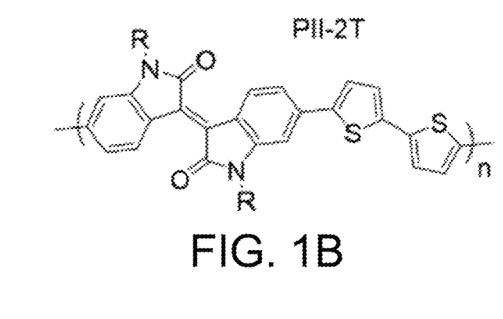
Figure 1C:
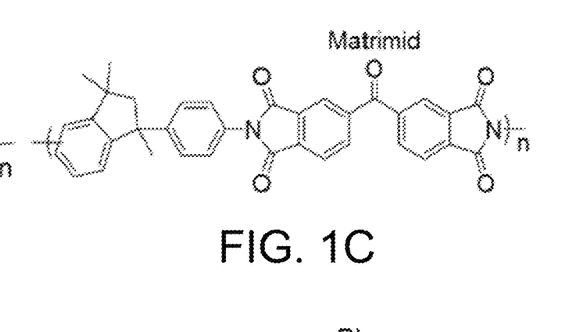
Figure 1D:
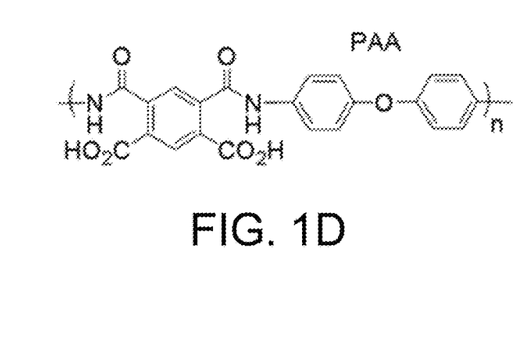
Figure 1E:
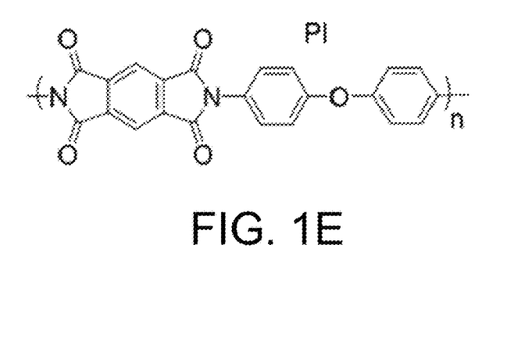

FIG. 1A represents a first nonlimiting embodiment of a transistor device having an architecture as described above and comprising polyimide components. Specifically, the substrate was formed of Kapton® (poly (4,4'-oxydiphenylene-pyromellitimide), a polyimide film commercially available from DuPont Electronics, Inc. Corporation). Kapton® was used due to its thermal durability, its flexibility, and most importantly, its compatibility with the dielectric layer. Kapton® substrates were also available in different thickness gauges (25 μm for Kapton® FIN 100 and 125 μm for Kapton® FIN 500), which allowed for tuning the flexibility and the overall weight of the devices. The dielectric layer was formed of polyimide not only because it can be solution-processed from a readily available PAA precursor but also because it has excellent thermal stability, excellent capacitive properties, and low power consumption in transistor devices.

The semiconductor layer was formed of a polymer blend that was annealed to form a network comprising a semiconducting polymer confined in a high-$T_g$ host matrix material. An isoindigo-bithiophene-based polymer (PII-2T) was used as the semiconducting polymer for its heat resistant semiconducting properties. Matrimid® 5218 (MI; a thermoplastic polyimide based on a proprietary diamine, 5(6)-amino-1-(4' aminophenyl)-1,3,-trimethylindane commercially available from Huntsman Advanced Materials Americas LLC) was used as the matrix material to improve the thermal stability of the semiconducting layer, while increasing its compatibility with the consecutive layers.

FIGS. 1B, 1C, 1D, and 1E represent molecular structures of PII-2T, MI, polyamic acid (PAA; used as a precursor solution to process polyimide (PI)), and polyimide, respectively.

Figure 2A:
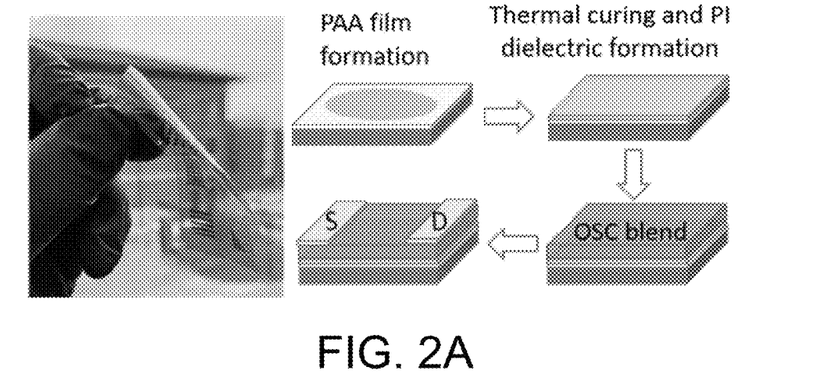
FIGS. 2A through 2E represent (FIG. 2A) a fabrication method for polyimide-based transistor devices, micrographs of Kapton® 100 substrates with patterned Al gates and the sequential layering device fabrication with atomic force microscope (AFM) height images of (FIG. 2B) a very smooth thermally-cured dielectric layer and (FIG. 2C) an interpenetrating film of PII-2T/Matrimid® blend processed on top of the PI dielectric, and characteristic (FIG. 2D) transfer curve and (FIG. 2E) output curve of the measured transistor devices showing ideal behavior, as well as low power consumption (VDS of about 10 V).
Figure 2B:
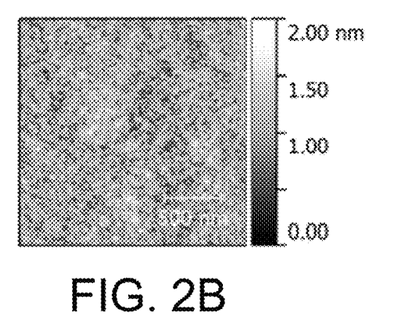

The transistor device may be fabricated by first patterning and depositing conducting gate contacts (e.g., formed of aluminum or alloys thereof) on cleaned Kapton® substrates. A PAA solution may then be spin coated onto the patterned substrate as represented in FIG. 2A. The PAA coated-thin film may be thermally cured until full imidization to produce a smooth film (e.g., root-mean-square=0.22 nm) of PI dielectric layer as represented in FIG. 2B. In certain embodiments, the resulting smooth film may have a thickness of about 200 nm and a capacitance of about 4.5 $nF/cm^2$. The solvent resistance and robustness of the formed dielectric layer allows for processing the semiconducting layer on top.

Figure 2C:
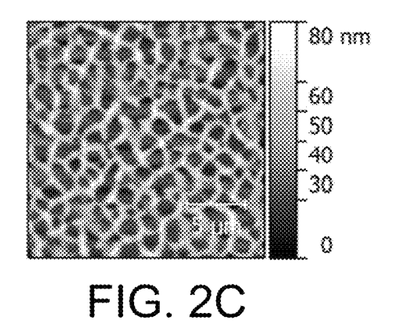

A MI/PII-2T blend can be processed using blending strategies similar to those described in Gumyusenge, A.; Tran, D. T.; Luo, X.; Pitch, G. M.; Zhao, Y.; Jenkins, K. A.; Dunn, T. J.; Ayzner, A. L.; Savoie, B. M.; Mei, J. Semiconducting polymer blends that exhibit stable charge transport at high temperatures. Science 2018, 362, 1131-1134, incorporated herein in its entirety by reference. The MI/PII-2T blend may be deposited on the dielectric layer by spin coating from a chloroform mixture yielding, for example, about a 150 nm thin film. The MI/PII-2T blend may then be annealed to form a bicontinuous network in which the PII-2T is surrounded by the MI as represented in FIG. 2C, a feature that may be beneficial for improving the thermal stability in the thin film. After annealing the semiconducting layer, the device structure can be completed by depositing source/drain contacts (e.g., formed of gold or alloys thereof) on the semiconducting layer.

Figure 2D:
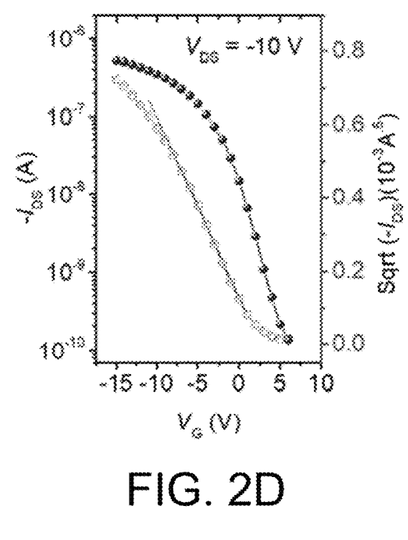
Figure 2E:
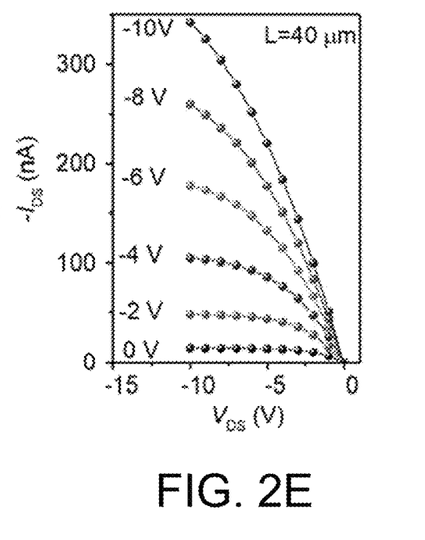

Investigations were carried out to analyze MI/PII-2T blends, described hereafter, which indicated that transistor devices fabricated according to the above described method were flexible, light-weight with charge carrier mobilities as high as 0.20 $cm^2/Vs$, ON to OFF current ratios around 104, and with threshold voltages of up to 3 V or more, while requiring operation voltages as low as 10 V (FIGS. 2D and 2E). Other properties, such as low hysteresis and low leakage currents, were also achieved.

To test the thermal stability of the transistor devices fabricated by this method, the electronic properties were measured from room temperature up to 220° C. in ambient air. In typical electronics, such thermal stress may lead to an uncontrolled increase in charge carrier density potentially leading to excessive doping levels and carriers scattering which may result in a loss of amplifying power of the transistor devices. Especially for conventional organic semiconductors, in this temperature regime, morphological fluctuations and thermal expansion often leads to significant decline in device performance.

Figure 3A:
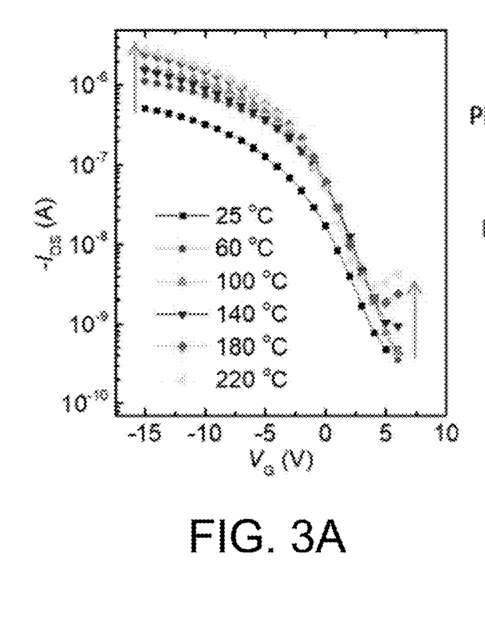
FIGS. 3A through 3D represent (FIG. 3A) characteristic transfer current of the plastic device under different heating temperatures (current increases indicative of a thermally activated behavior that remains stable even when the operating temperature reaches 220° C.), (FIG. 3B) in situ temperature-dependent device characterization set up with precise temperature control, temperature-dependent (FIG. 3C) ON and OF currents, and (FIG. 3D) threshold voltage of the transistor device measured in open air.
Figure 3B:
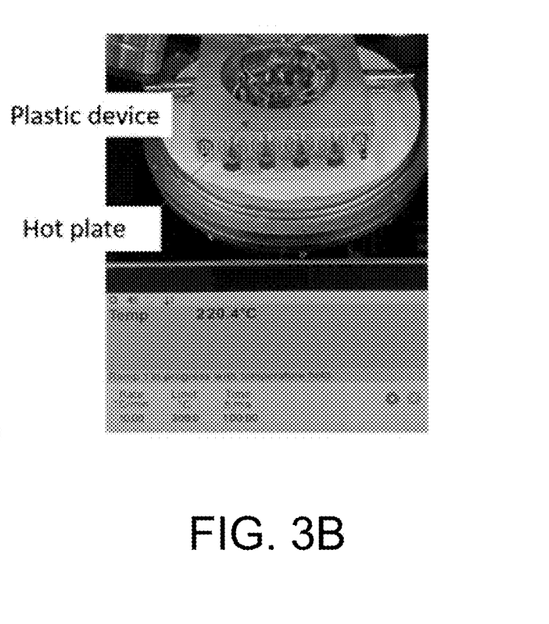
Figure 3C:
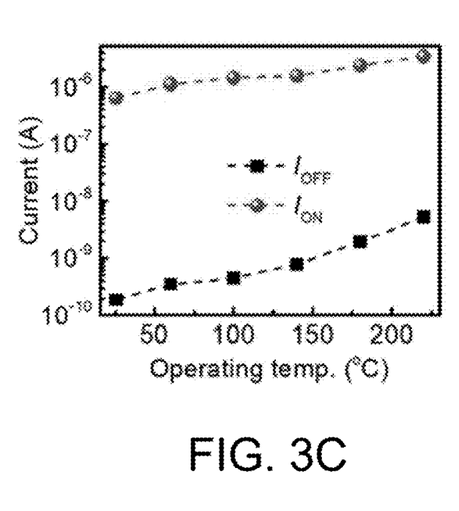
Figure 3D:
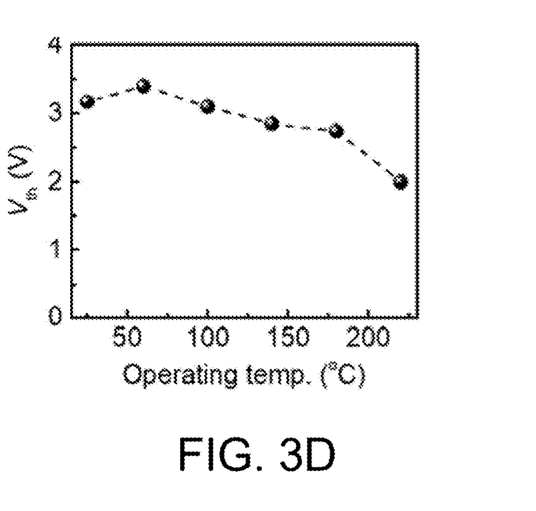

FIG. 3A represents measured source/drain current with increasing temperature of the tested transistor devices. Upon heating, the thermally-activated increase in the charge carrier density led to increased ON and OFF currents, but the devices retained the ideal behavior and stable currents at all temperatures. These transistor devices were able to retain their $I_{ON}/I_{OFF}$ even when operating at 220° C. in the open air (FIG. 3C). The extracted threshold voltage was also observed to have minimal variation as the operating temperature increased (FIG. 3D).

An in situ temperature-dependent capacitance investigation also revealed that the PI dielectric layer was able to retain excellent capacitive behavior even when under baking conditions. This excellent thermal stability of the transistor devices was attributed to the compatibility in thermal expansion between the polyimide-based components of the transistor devices and to the blending strategy, which enabled the semiconducting polymer chains (PII-2T) to remain confined by the polyimide host matrix material (Matrimid®). This confinement in the bicontinuous network minimized morphological variations and reduced carriers scattering.

Figure 4A:
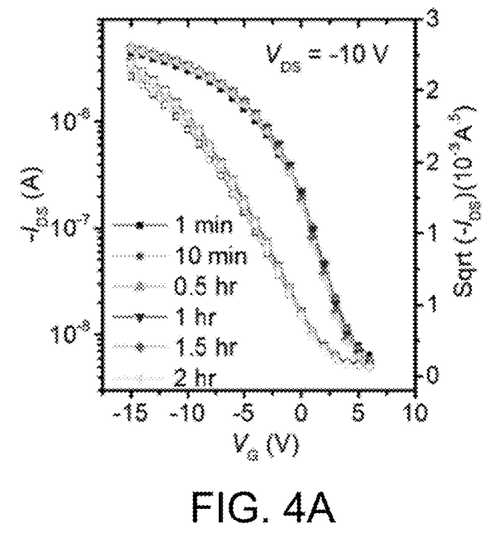
FIGS. 4A through 4D represent characteristic (FIG. 4A) transfer and (FIG. 4B) output curves of a typical plastic transistor device measured with increasing heating time at 195° C., and the transistor devices exhibiting minimal change in (FIG. 4C) current ratio and (FIG. 4D) the threshold voltage even after two hours of constant baking.
Figure 4B:
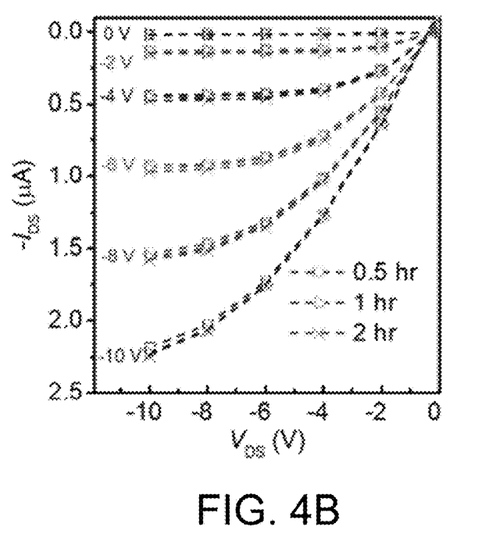
Figure 4C:
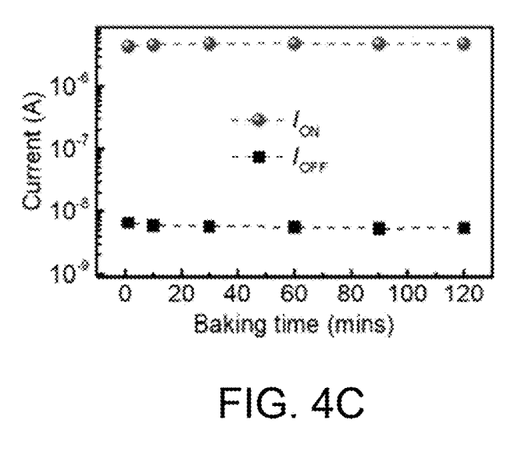
Figure 4D:
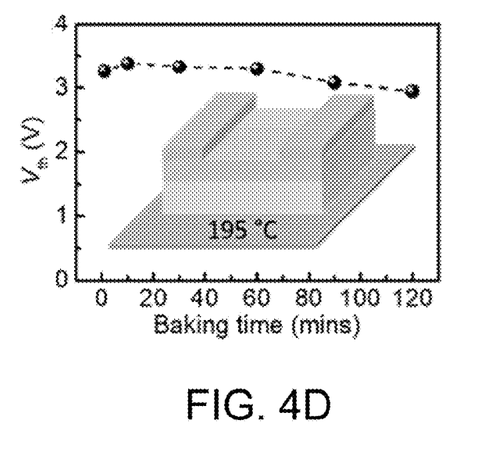

To further test the thermal durability of the transistor devices, the transistor device properties were tested under continuous heating at 195° C., equivalent to a baking oven environment. Upon baking, the transistors devices retained ideal transfer and output characteristics as shown in FIGS. 4A and 4B. More importantly, these characteristics were retained after two hours of heating in an open air environment. FIG. 4C represents the measurements which indicated minimal to no change in the ON and OFF currents with increasing baking time. Similarly, the threshold voltage was observed to remain around 3 V even after two hours of heating (FIG. 4D).

In conventional transistor devices, prolonged heating often leads to increased charge carriers scattering and uncontrolled changes in threshold voltages resulting in an increase in power consumption. In the present transistor devices, the required operational voltage (VDS) was kept at about 10 V during the investigations and the transistor devices still maintained excellent electronic properties. This ideality renders this approach an excellent candidate for various high temperature applications, such as sensing devices, in which functional device components can sustain long-term heating with minimal power consumption.

Figure 5:
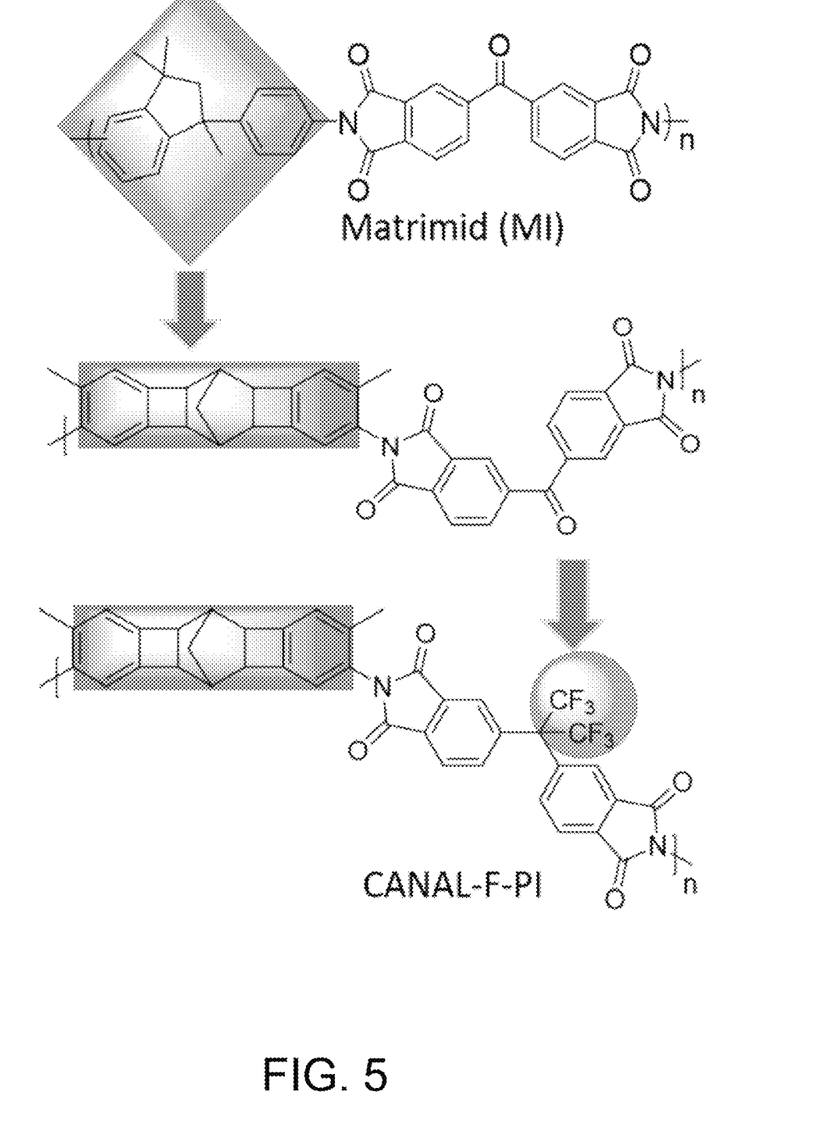
FIG. 5 schematically represents a molecular design approach for producing thermally robust polyimides via a catalytic arene-norbornene annulation (CANAL) method for use in high performance thermally stable semiconducting polymer blends. The copolymer represented is a ladder-imide copolymer (CANAL-F-PI) derived from a parent Matrimid® (MI).

In certain embodiments, the host matrix material may include polyimide derivatives produced through polycondensation of CANAL ladder diamines with diphthalic anhydrides. As a nonlimiting example, FIG. 5 represents a molecular design principle of a ladder-imide copolymer (CANAL-F-PI) derived from Matrimid® (MI). Such polyimide derivatives may be fabricated using, in part, a catalytic arene-norbornene annulation (CANAL) method described in Abdulhamid, M. A.; Lai, H. W. H.; Wang, Y.; Jin, Z.; Teo, Y. C.; Ma, X.; Pinnau, I.; Xia, Y., Microporous Polyimides from Ladder Diamines Synthesized by Facile Catalytic Arene-Norbornene Annulation as High-Performance Membranes for Gas Separation. Chem. Mater. 2019, 31, 1767-1774, incorporated in its entirety herein by reference.

The modified structure represented in FIG. 5 encompasses two highlighted features of note. The first part exploits the benefits of using as the solubilizing unit the moiety of polyimide derivatives fabricated using the CANAL method (hereinafter, "CANAL moiety"). The second part of this design targets the fluorination on the anhydride half of the monomer, that is, replacing the ketone group with a hexafluorinated analogue.

Investigations were carried out comparing MI/PII-2T blends to CANAL polymer blends, as well as thin films and transistor devices made therefrom.

Figure 6A:
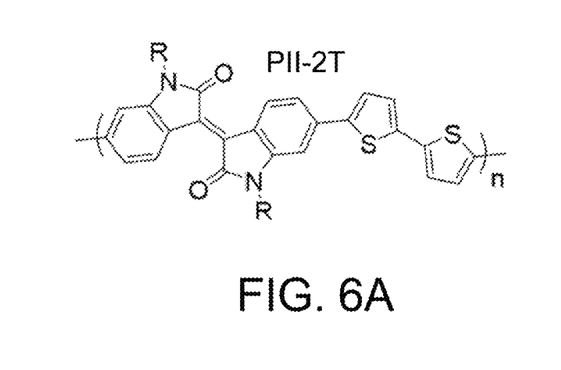
FIG. 6A represents a molecular structure of a semiconducting polymer used for blending.
Figure 6B:
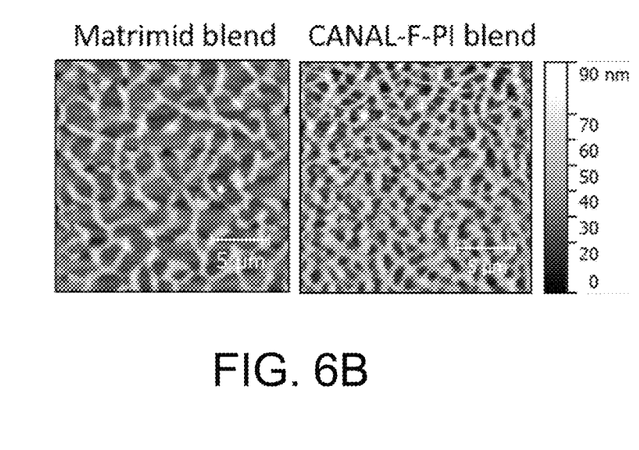
FIG. 6B represents AFM height images revealing improved connectivity in the blend film of CANAL-F-PI in comparison to MI in the same blending ratio.
Figure 6C:
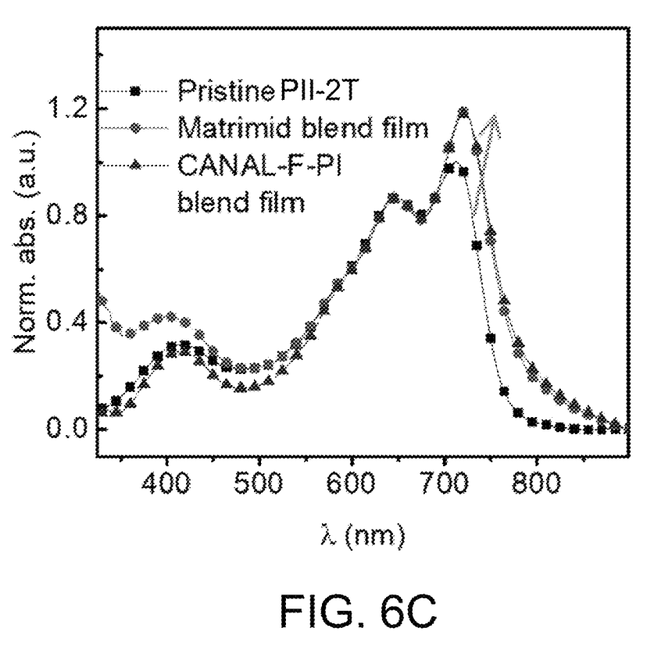
FIG. 6C represents normalized absorption spectra of PII-2T in its pristine form compared to its MI and CANAL-F-PI blends. A significant redshift accompanied with increased peak intensity in the 0-0 vibronic peak was observed.

One of the direct indicators of the blending efficiency in this type of system is the ability for the host matrix material to confine the domains of the semiconducting polymer(s) and improve their ordering. As a result, the confined polymer chains exhibit improved planarity and packing which is beneficial when under thermal stress. To test this effect, UV-Vis absorption was utilized to probe the changes in the signature vibronic peaks for chain ordering and packing. To probe the ability of the CANAL polymer to confine the conjugated polymer domains and compare such behavior to that found in the parent MI, blend films were processed with an isoindigo-based semiconducting polymer (PII-2T as shown in FIG. 6A). The absorption spectra of the annealed blend films was probed and compared to pristine PII-2T films. As shown in FIG. 6C, upon blending with the polyimides, the maximum absorption peak not only showed to redshift indicative of improved aggregation, but also significantly increased in intensity due to improved planarization and ordering of the semiconducting polymer chains. It was thus concluded that like the MI, the ladder-imide copolymer induced ordering of PII-2T upon blending.

In addition to physically confining the conjugated polymer chains and thus improving their aggregation behavior, the ability of the host matrix material to efficiently mix with the semiconducting polymer domains is another indicator of the blending efficiency. This miscibility between domains of the conjugated polymer and the rigid matrix is a factor for the resulting thermal stability. Also noteworthy, the polyimide-based blends exhibited the formation of large domains in the films (FIG. 6B) indicative of poor miscibility with the domains of the semiconductor material, and one of the causes of relatively poor electronic performance of the transistor devices made therefrom. To probe the improvement in the compatibility within the blend films, the blend morphology was imaged in films processed by spin coating the conjugated polymer and the ladder copolymer. As shown in FIG. 6B, AFM height images revealed that PII-2T could readily form a well interpenetrating network of its aggregated domains within the CANAL-F-PI polymer even when low blend contents (<40 wt % of PII-2T) were utilized. In contrast, MI required as high as 55% of the conjugated polymer to establish such a network. This enhanced domain miscibility was attributed to the improved hydrophobicity of the host matrix material, owing to the presence of the hexafluoroisopropylidene groups, which rendered the blend components much more compatible so that the isoindigo domains were not forced to form isolated micelles during the film formation. Instead, the domains could readily be uniformly distributed within the host matrix material, and with the proper composition, a uniform and compact network may be formed as evidenced by the topology AFM height images.

Within the high temperature semiconducting polymer blends, the host matrix material was utilized as the major component to dictate the rigidity of the film. It was thus of great interest to probe how the presence of such large amounts of the insulating component in the channel layer may impact the electronic performance of field-effect transistors (FET) devices that include the host matrix material due to the capacitive nature of such insulators. From the UV-Vis studies and morphology characterization, it was observed that MI induced a desired chain planarization and aggregation along with the formation of an interpenetrating morphology. In theory, once past the percolation threshold, such aggregation would be expected to lead to improved charge transport. However, poor electronic properties were observed in resulting blends hinting that charge carriers were unable to effectively delocalize within these blends.

With a capacitive component within the channel layer, the charges accumulated at the gate interface became even slower once injected in the channel layer, that is, the semiconducting layer began to act as a charge trapping region. With such blockage of charge carriers, it was predicted that such blends would yield poor charge mobilities. Therefore, one of the properties targeted in the fluorinated polyimides was their low dielectric constant and the impact of such on the electric performance of resulting semiconducting blends.

Figure 7A:
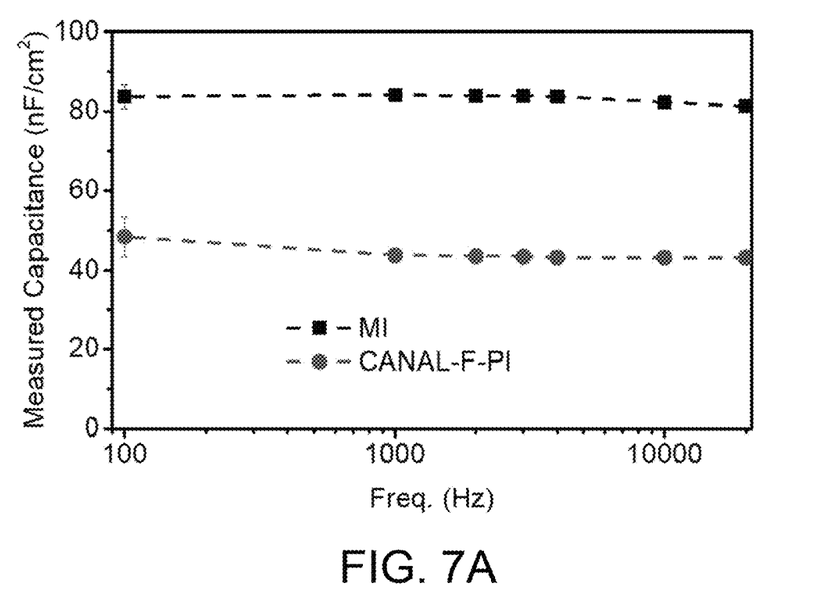
FIG. 7A represents frequency-dependent capacitance of CANAL-F-PI film in comparison to MI. The capacitance could be lowered by half through molecular design.

To probe the effect on the charge mobility in the blend films, capacitance measurements were performed on both MI and CANAL-F-PI films. The corresponding films were processed in the same manner as the semiconducting blends. The thin films of the insulators were sandwiched between two conductive layers (ITO and Au) and an electric field was applied on the resulting capacitor. FIG. 7A represents the measured capacitance in such sandwich configuration from the two tested polyimides. It was observed that these films were highly capacitive as they were processed to be extremely thin (around 50 nm). It could also be seen that in accordance to the molecular design, the copolymer with fluorine atoms was twice less capacitive than MI.

The thickness-dependent dielectric constant (k) for these matrices was back-calculated using the following classical equation $k=C(d/(A*k_o))$ where k is the dielectric constant, C is the measured capacitance, d and A are the distance between the two conductive layers and the area of the two conductive layers, respectively. $k_o$ is the permittivity of vacuum (8.854 pF/m). The thickness of the films was extracted to be 50 (±3) nm. The area of the conductive contacts was measured to be about 1.1 mm². The corresponding dielectric constants were thus calculated to be around 4.5 for MI and 2.4 for CANAL-F-PI.

Figure 7B:
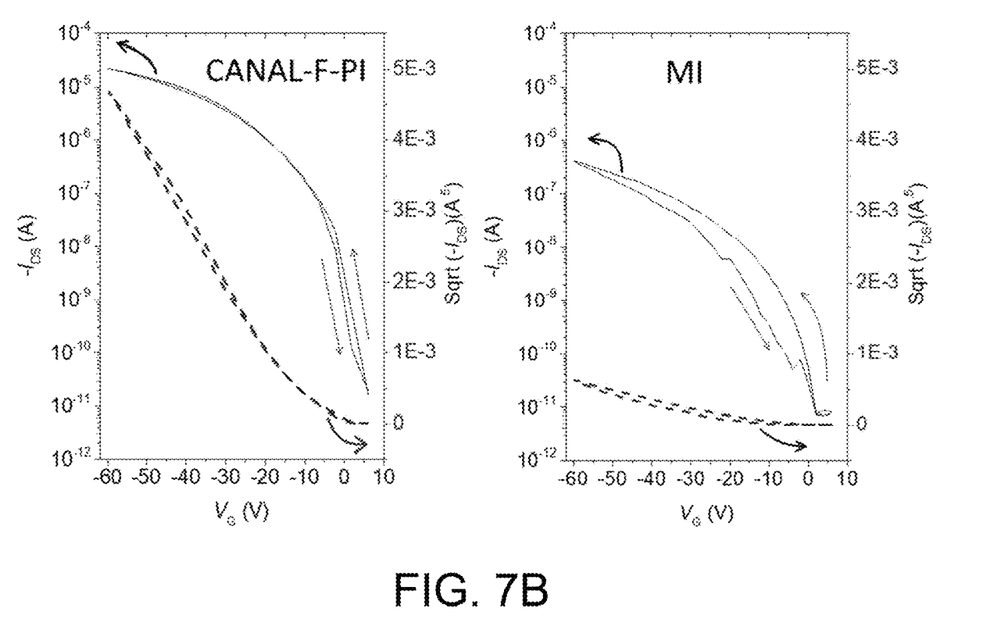
FIG. 7B represents characteristic transfer curve obtained from the device made of the two studied blends with PII-2T. A significant improvement in both hole mobility and device hysteresis can be realized when a low capacitance host matrix is used.

To test the expected superiority in electronic performance in the blends from CANAL-F-PI, the transistor devices were fabricated using 40 wt % blends of PII-2T. The performance of the two blends were then tested and compared to the pristine polymer film (PII-2T). PII-2T, as discussed above, offers modest transistor device performance which had been shown to barely benefit from the fiber-like morphology and aggregation induced by the presence of MI in the blends. Charge mobilities no higher than 0.15 cm²/Vs could be attained in the case of PII-2T/MI. The CANAL-F-PI based blends were observed to boost these mobilities to 0.75 cm²/Vs on average (maximum value of 0.86). As shown in FIG. 7B, the transfer characteristics from an average device made with each blend film reveal superior electronic performance from CANAL-F-PI blends in comparison to MI blends. More intriguingly, the measured mobility from the blends using ladder-imide copolymer was significantly higher than the mobility measured from pristine PII-2T (about 0.2 cm²/Vs). This increase in mobility showed that polyimides can indeed be used for the aggregation-induced mobility enhancement, but their capacitive and charge trapping properties have to be taken into consideration when designing corresponding semiconducting blends.

To test the reduced trap density in the case of a fluorinated matrix, a hysteresis measurement was used to compare MI and CANAL-F-PI. During the hysteresis measurement, the gate bias was swept forward and backward, and the resulting current curves were overlapped for comparison. In case of little to no charge trapping, the forward and backward scans should yield overlapping current curves. This measurement is an indicator to probe the interface quality in terms of charge trapping defects. As seen in FIG. 7B, the transistor devices based on CANAL-F-PI blend films exhibit nicely overlapping forward and backward scans. Conversely, the MI-based blends yielded significantly worsened overlap indicative of higher hysteresis, that is, a higher degree of charge trapping. From most of the MI-based devices measured, not only did the backward scan current not overlap the forward scan, but it was also less stable in ambient which hints that in these blends, the charge carriers are slowed down by different trapping sites. This trapping behavior could be explained by the polarizable groups in MI which were found to increase its inherent capacitance. Such behavior may have been suppressed when the molecularly engineered poly(ladder-imide) was utilized.

To test the thermal stability of the CANAL-F-PI blends, their thermal limit was probed by increasing the operating temperature at ambient. Since the host matrix material exhibited no thermal degradation up to 400° C., it was predicted that the resulting FET devices could also sustain extreme conditions, at least below the decomposition temperature of the semiconductor. The fabricated transistors devices were heated up to 300° C. in the open air and the charge carrier mobility was measured after 30 minutes at each temperature. The FET devices remained functional even after heating to 300° C. in the open air. However, a steady decline in performance was observed as the devices spent more time exposed to open air. This decline was mostly attributed to the fact that CANAL-F-PI is inherently porous which could lead to moisture-induced decline in device performance. Nonetheless, the extracted transfer characteristics show that such blending systems would sustain, for instance high temperature anneals that are commonly used in manufacturing, a requirement that most organic electronic systems fail to meet.

Figure 8A:
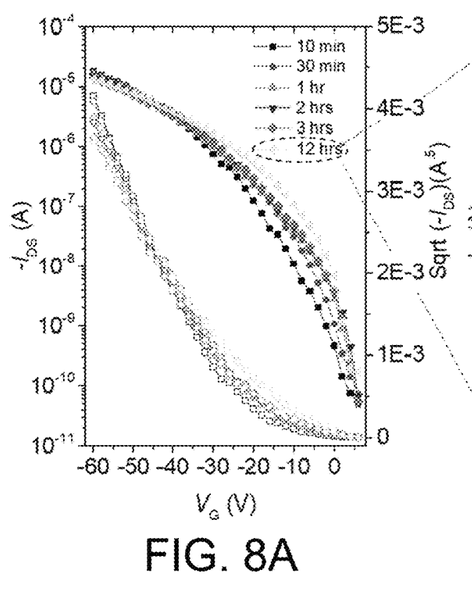
FIGS. 8A through 8C represent baking characterization of transistor devices based on CANAL-F-PI blends. Overlapping current curves were observed when the devices were subjected to constant thermal stress at 200° C. up to twelve hours Baking analysis of the transistor devices based on PII-2T/CANAL-F-PI blends. The extracted ON/OFF currents exhibit excellent stability even after baking for twelve hours under $N_2$.
Figure 8B:
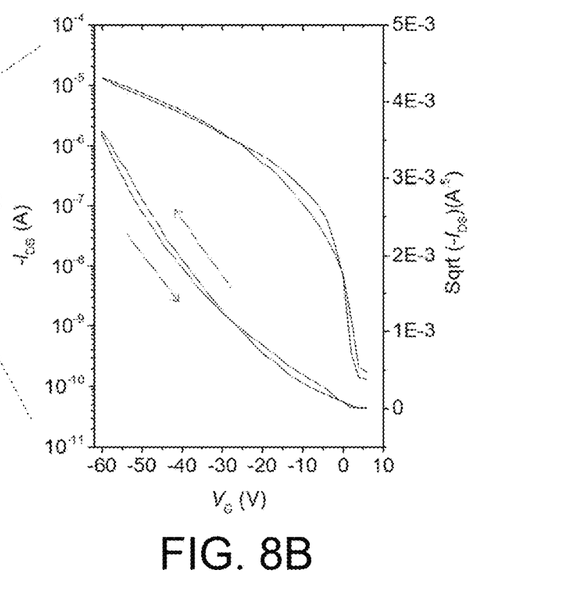
Figure 8C:
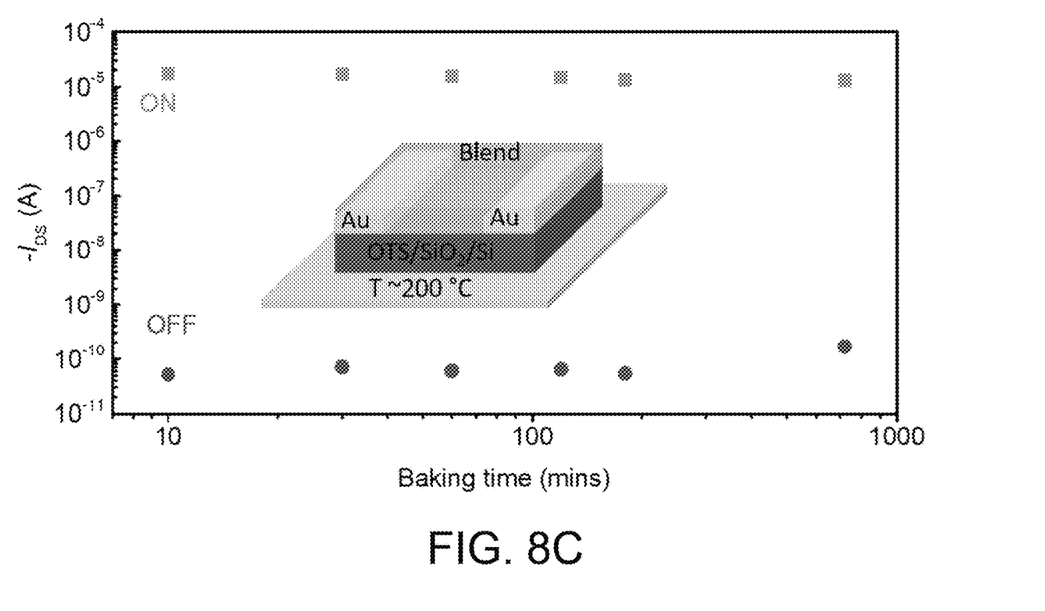

To accurately test the thermal robustness of the blend films, their tolerance towards prolonged baking was measured. Specifically, the bottom-gate bottom-contact devices were baked at 200° C. under nitrogen up to 12 hours and the thermal stress response was continuously monitored. The CANAL-F-PI blend-based transistor devices exhibited excellent thermal tolerance as seen from the overlapping transfer characteristic curves in FIG. 8A. When the ON and OFF drain current were further extracted from the baked devices, minimal changes could be observed even after twelve hours of uninterrupted heating (FIGS. 8A through 8C). This excellent thermal stability observed in the devices made from the ladder polyimide blends could be credited to the thermal robustness of the host matrix material enabling extremely stable semiconducting polymer blends. Note that these blends were intentionally measured under nitrogen environments since CANAL-based polyimides possess inherent porosity which renders their behavior to be directly influence by the moisture. In fact, this is envisioned as a venue for high temperature gas sensing as the permeability of the copolymer can readily be tuned by designed functionalization of the CANAL moiety.

Furthermore, tests were conducted to determine whether the CANAL-F-PI films which exhibited minimal charge trapping behavior (minimal hysteresis behavior) at room temperature could retain such a beneficial property after prolonged thermal stress. The forward and backward scans were then performed on the transistor devices that were heated for twelve uninterrupted hours at 200° C. The hysteresis curves revealed that even under these oven-like conditions, overlapping forward and backward currents could be obtained in the blend films as shown in FIG. 8B. The lowered capacitive nature of the copolymer in combination with its thermal robustness afforded effective charge delocalization even under harsh thermal environments. This indicated that the selected copolymer and resulting semiconducting blends are excellent candidates for electronics that must function under extreme thermal conditions.

In view of the above investigations, the use of blended polymers for high temperature operation stability offers the opportunity of bridging the best of both worlds from the semiconducting polymers and the rigid host matrix materials. In particular, the ladder-imide copolymers provided improved thermal stability of the matrix. At the same time, it was determined that improvements to the electronic performance of the blends can be achieved by designing matrices that, while effectively housing the semiconductor, do not trap the charge carriers. Substituting carbonyl groups by the hexafluoroisopropylidene not only lowered the dielectric constant of the matrix material in comparison the parent polyimide, but also improved the interconnectivity in the blend morphology. The increased hydrophobicity in the copolymer improved the blend compatibility and the fluorination led to lower polarizability and therefore lowered capacitance. It is envisioned such matrices will find applications in extreme temperature applications such as gas and pressure sensing.

While the invention has been described in terms of specific embodiments, it is apparent that other forms could be adopted by one skilled in the art. For example, the physical configuration of the transistor devices could differ from that shown, and materials and processes/methods other than those noted could be used. In addition, the invention encompasses additional embodiments in which one or more features or aspects of different disclosed embodiments may be combined. Therefore, the scope of the invention is to be limited only by the following claims.

The invention claimed is:

1. A transistor device comprising:
a substrate comprising metallic gate contacts;
a dielectric layer on the substrate comprising a polyimide or derivative thereof;
a semiconductor layer on the dielectric layer comprising a semiconducting polymer confined in a host matrix material, wherein the host matrix material is a polyimide derivative with a molecular structure comprising a CANAL moiety; and
source and drain contacts on the semiconductor layer.

2. The transistor device of claim 1, wherein the dielectric layer is formed of a polyamic acid solution annealed to full imidization.

3. The transistor device of claim 1, wherein the semiconducting polymer is an isoindigo bithiophene based polymer.

4. The transistor device of claim 1, wherein the host matrix material is a thermoplastic polyimide.

5. The transistor device of claim 1, wherein the molecular structure of the polyimide derivative includes a hexa fluorinated analogue.

6. The transistor device of claim 1, wherein the substrate comprises a polyimide.

7. The transistor device of claim 1, wherein the metallic gate contacts on the substrate comprise aluminum or an alloy thereof and the source and drain contacts on the semiconductor layer comprise gold or an alloy thereof.

8. A method of fabricating a transistor device, the method comprising:
patterning and depositing metallic gate contacts on a substrate;
producing a dielectric layer on the substrate comprising polyimide;
producing a semiconductor layer on the dielectric layer comprising a semiconducting polymer confined in a host matrix material, wherein the host matrix material is a polyimide derivative with a molecular structure comprising a CANAL moiety; and
depositing source and drain contacts on the semiconductor layer.

9. The method of claim 8, further comprising forming the dielectric layer from a polyamic acid solution.

10. The method of claim 9, further comprising depositing the polyamic acid solution onto the substrate to form a film thereon and thermally curing the film until full imidization is complete.

11. The method of claim 8, further comprising forming the semiconductor layer by depositing a polymer blend onto the dielectric layer to form a film thereon and annealing the film.

12. The method of claim 8, wherein the semiconducting polymer includes an isoindigo bithiophene based polymer.

13. The method of claim 8, wherein the host matrix material is formed of a thermoplastic polyimide.

14. The method of claim 8, wherein the molecular structure of the polyimide derivative includes a hexa fluorinated analogue.

15. The method of claim 8, wherein the polyimide derivative is produced through polycondensation of CANAL ladder diamines with diphthalic anhydrides.

16. The method of claim 8, wherein the substrate is formed of a polyimide film.

17. The method of claim 8, wherein the metallic gate contacts on the substrate comprise aluminum or an alloy thereof and the source and drain contacts on the semiconductor layer comprise gold or an alloy thereof.

18. A method of fabricating a transistor device, the method comprising:
patterning and depositing metallic gate contacts on a substrate;
producing a dielectric layer on the substrate comprising polyimide;
producing a semiconductor layer on the dielectric layer comprising a semiconducting polymer confined in a host matrix material, wherein the host matrix material is a polyimide derivative comprising a thermoplastic polyimide modified to comprise a CANAL moiety and a hexa fluorinated analogue that replaces a ketone group on an anhydride half of a monomer thereof; and
depositing source and drain contacts on the semiconductor layer.

* * * * *